United States Patent
Lin (10) Patent No.: US 6,839,860 B2
(45) Date of Patent: Jan. 4, 2005

(54) CAPTURE CLOCK GENERATOR USING MASTER AND SLAVE DELAY LOCKED LOOPS

(75) Inventor: Feng Lin, Boise, ID (US)

(73) Assignee: Mircon Technology, Inc., Boise, ID (US)

( * ) Notice: Subject to any disclaimer, the term of this patent is extended or adjusted under 35 U.S.C. 154(b) by 639 days.

(21) Appl. No.: 09/838,525

(22) Filed: Apr. 19, 2001

(65) Prior Publication Data

US 2002/0157031 A1 Oct. 24, 2002

(51) Int. Cl.[7] .................................................. G06F 1/04
(52) U.S. Cl. ............................ 713/401; 713/503
(58) Field of Search .......................... 713/400, 401, 713/500, 501, 503, 600

(56) References Cited

U.S. PATENT DOCUMENTS

| | | | |
|---|---|---|---|
| 5,109,394 A | 4/1992 | Hjerpe et al. ............... 375/119 |
| 5,355,037 A | 10/1994 | Andresen et al. ........... 307/602 |
| 5,399,995 A | 3/1995 | Kardontchik et al. ......... 331/17 |
| 5,604,775 A | 2/1997 | Saitoh et al. ............... 375/376 |
| 5,744,991 A | 4/1998 | Jefferson et al. ............ 327/158 |
| 5,796,673 A | 8/1998 | Foss et al. .................. 365/233 |
| 5,936,912 A * | 8/1999 | Kawabata et al. .......... 365/233 |
| 5,963,069 A | 10/1999 | Jefferson et al. ............ 327/158 |
| 5,964,880 A * | 10/1999 | Liu et al. .................... 713/401 |
| 5,969,551 A * | 10/1999 | Fujioka ...................... 327/149 |
| 6,014,048 A | 1/2000 | Talaga, Jr. et al. .......... 327/156 |
| 6,049,239 A | 4/2000 | Eto et al. .................... 327/158 |
| 6,069,506 A | 5/2000 | Miller, Jr. et al. .......... 327/156 |
| 6,075,415 A | 6/2000 | Milton et al. ................ 331/25 |
| 6,101,197 A | 8/2000 | Keeth et al. ................ 370/517 |
| 6,125,157 A | 9/2000 | Donnelly et al. ........... 375/371 |
| 6,130,552 A | 10/2000 | Jefferson et al. ............. 326/39 |
| 6,297,680 B1 | 10/2001 | Kondo ........................ 327/278 |
| 6,336,190 B1 * | 1/2002 | Yamagishi et al. ......... 713/400 |
| 6,445,231 B1 | 9/2002 | Baker et al. ................ 327/158 |
| 6,469,555 B1 * | 10/2002 | Lau et al. .................... 327/158 |

FOREIGN PATENT DOCUMENTS

| | | | |
|---|---|---|---|
| DE | 10003454 | 8/2000 | ............ H03K/5/13 |
| JP | 02-049438 | 2/2002 | ............. G06F/1/10 |

\* cited by examiner

*Primary Examiner*—Dennis M. Butler
(74) *Attorney, Agent, or Firm*—Schwegman, Lundberg, Woessner & Kluth, P.A.

(57) ABSTRACT

A clock generator comprising a master delay locked loop (DLL) and a slave DLL to capture a data signal. The slave DLL generates a slave output signal based on a clock signal. The master DLL receives the slave output signal and compensates variations in delays of the data and clock signals to generate a capture clock signal. When the master and slave DLLs are locked, the capture clock signal is center aligned with the data signal.

43 Claims, 9 Drawing Sheets

CAPTURE CLOCK GENERATOR USING MASTER AND SLAVE DELAY LOCKED LOOPS

TECHNICAL FIELD OF THE INVENTION

The present invention relates generally to data communication, and in particular to a capture clock generator.

BACKGROUND OF THE INVENTION

In data communication, data are often transferred from one circuit to another circuit for processing. To capture a data signal, a data capture circuit is used. The data capture circuit normally uses a clock signal to capture the data signal. The clock signal can be a system clock signal or an internal clock signal generated by a clock generator.

Figure 1A:
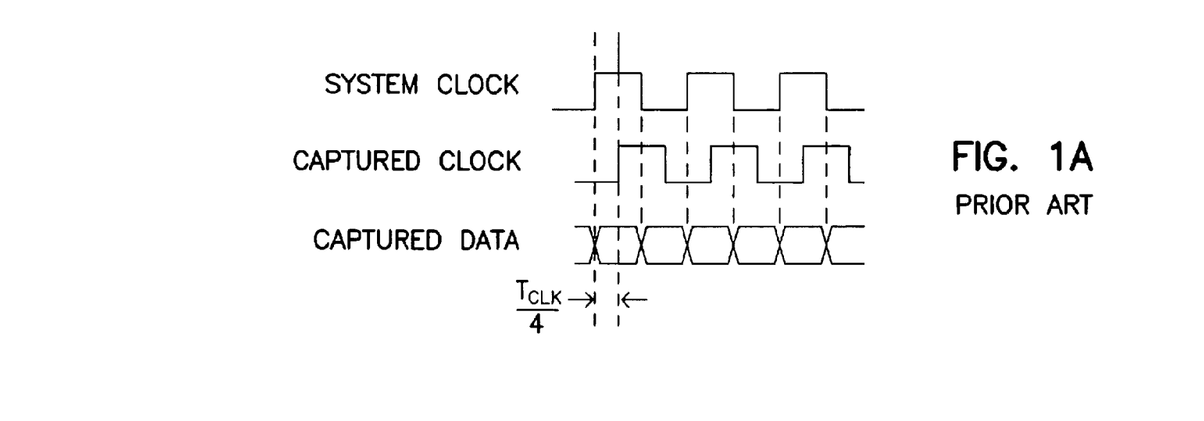
FIG. 1A is a diagram showing timing relationship between clock and data signals of a prior art capture circuit in FIG. 1B.

FIG. 1A is a block diagram illustrating one traditional clock and data signal relationship of a capture circuit. In this method, the system clock signal is edge aligned with the captured data signal while the capture clock signal is center aligned with the data eye. In other terms, the capture clock signal is 90 degrees out of phase or one-fourth clock cycle delayed from the system clock signal and is center aligned with the data signal.

Figure 1B:
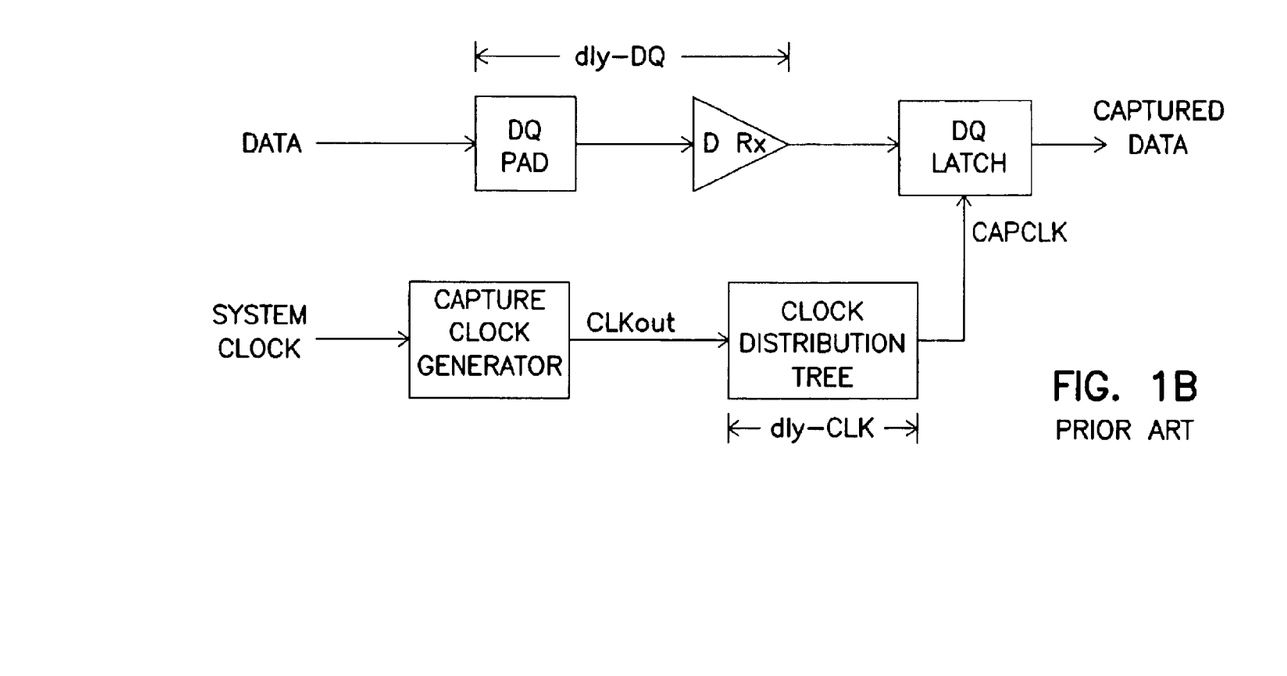
FIG. 1B is a block diagram of a prior art capture circuit.

FIG. 1B illustrates possible data and clock paths of a capture circuit in a memory device or a memory controller. In this circuit, a data latch (DQ latch) uses a capture clock signal (CAPCLK) to capture an internal data signal (Din). The Din signal is a delayed version of an external data signal (DQ), which travels on a data path including a data pad (DQ pad) and a data receiver and driver (D Rx). The data path has a delay indicated by dly-DQ. The CAPCLK is provided by a clock distribution tree as a delayed version of an output clock signal (CLKout). The clock distribution tree has a delay indicated by dly-CLK. The CLKout clock signal is generated by a clock generator based on a system clock or an external clock signal (XCLK). The XCLK signal is edge aligned with the DQ signal.

From the data and clock paths of FIG. 1B, even if the CLKout signal is 90 degrees out of phase with the XCLK signal, the capture clock signal, CAPCLK, may not be center aligned with the Din data signal because of variations in delays of the dly-DQ and dly-CLK.

Conventionally, different techniques are used to match the delays of the data and clock paths, such as the dly-DQ and dly-CLK, to center align the capture clock signal to the data signal. A common characteristic of these techniques is adding delay elements to the data or clock path or both. The delay elements are then manually tuned in as an attempt to compensate the variations in delays between the clock and data paths. In some cases, tuning the delay elements may not provide satisfactory level of accuracy. Thus, the clock and data signals may not accurately be aligned for some devices, especially for high speed devices such as new generations of memory devices.

There is a need for another technique to generate a capture clock signal that is accurately center aligned with the data signal.

SUMMARY OF THE INVENTION

The present invention includes a novel capture clock generator having master and slave delay locked loops (DLLs) to generate a capture clock signal to capture a data signal. When the DLLs are locked, the capture clock signal is center aligned with the data signal.

In one aspect, a capture clock generator includes a receiving circuit to receive an external clock signal to produce an internal clock signal. A data receiver receives an external data signal to produce an internal data signal. A first DLL receives the internal clock signal to produce an output clock signal. The output clock signal is 90 degrees out of phase with the internal clock signal. A second DLL selectively connects to the first DLL to receive the output clock signal to generate a capture clock signal. When the second DLL is locked, the capture clock signal is 90 degrees out of phase with the internal data signal.

In another aspect, a method of generating a data signal includes receiving an external clock signal to generate an internal clock signal. An output clock signal is generated based on the internal clock signal. The output clock signal is 90 degrees out of phase with the internal clock signal. A capture clock signal is generated based on the output clock signal. The capture signal is used to captured an internal data signal to produce an output data signal. The output data signal is center aligned with the external clock signal.

DETAILED DESCRIPTION OF THE INVENTION

The following detailed description refers to the accompanying drawings which form a part hereof, and in which is shown, by way of illustration specific embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the resent invention. The following detailed description is, therefore, not to be taken in a limiting sense, and the scope of the invention is defined only by the appended claims.

Figure 2:
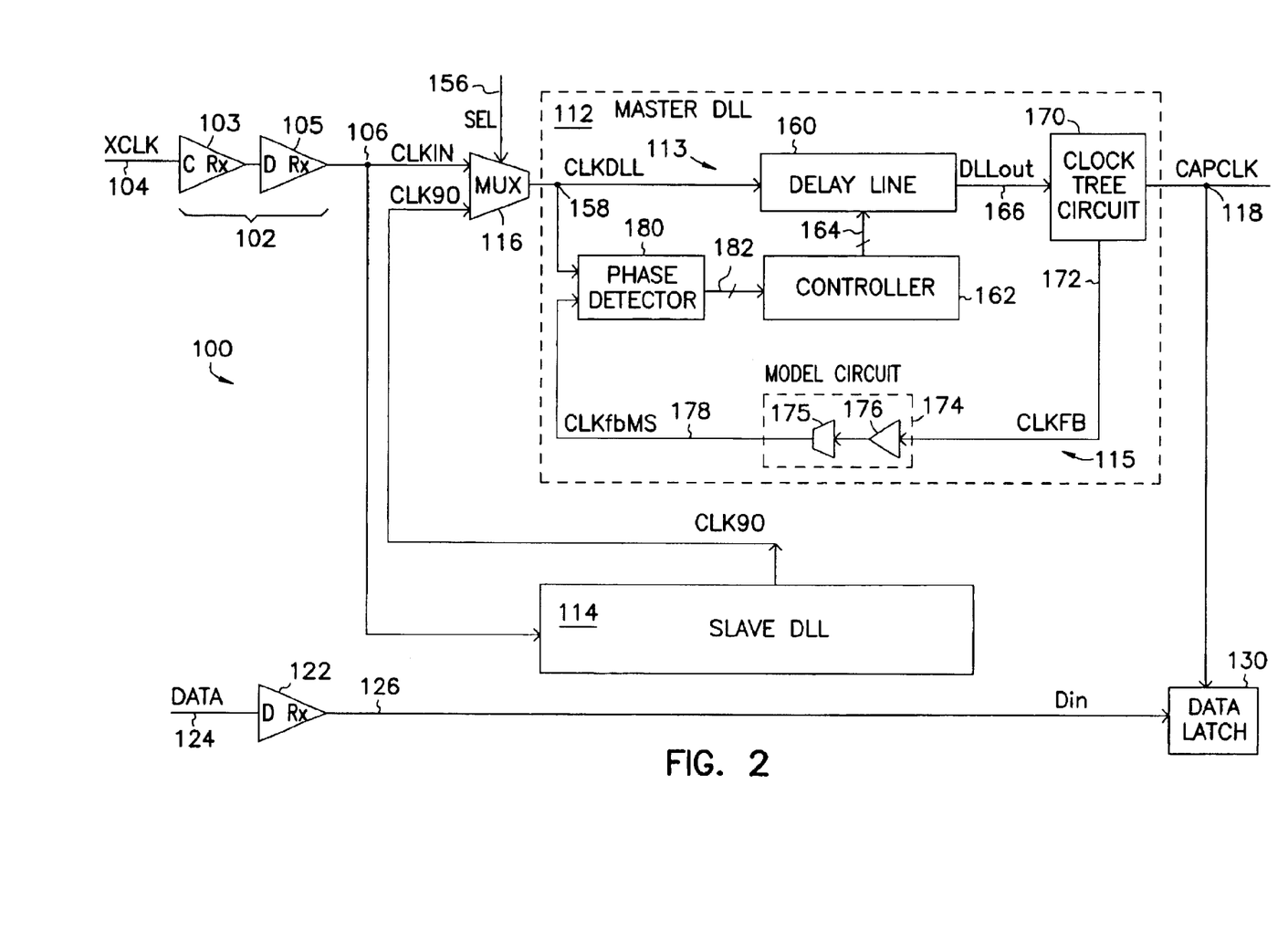
FIG. 2 is a block diagram of a clock generator according to one embodiment of the invention.

FIG. 2 is a block diagram of a clock generator 100 according to one embodiment of the invention. Clock generator 100 includes a receiving circuit 102, which has a clock receiver 103 (C Rx) connected to a data receiver model 105. Receiving circuit 102 receives an external clock signal XCLK at node 104 and provides an internal clock signal CLKIN at node 106. A data receiver 122 (D Rx) receives an external data signal DQ at node 124 and provides an internal data signal Din at node 126. The data receiver model 105 is used to track the delay of data receiver 122. Data receiver 122 and data receiver model 105 are identical.

A slave DLL 114 connects to receiving circuit 102 at node 106 to receive the CLKIN signal and generate a slave output clock signal CLK90. The CLK90 is 90 degrees out of phase with the CLKIN signal when slave DLL 114 is locked.

A digital master DLL 112 connects to receiving circuit 102 and slave DLL 114 through a multiplexor (MUX) 116. Based on the selection of MUX 116, master DLL 112 receives either the CLKIN or the CLK90 signal to generate a capture clock signal CAPCLK. The CAPCLK is used to capture the Din signal at a capture circuit 130.

Multiplexor 116 is controlled by a select signal SEL on line 156. Based on the signal relationship between the XCLK and DQ signals, the SEL signal enables MUX 116 to select either the CLKIN or CLK90 and passes it to node 158 of master DLL 112. If the XCLK and DQ signals are center aligned, the CLKIN signal is passed to master DLL 112. If the XCLK and DQ signals are edge aligned, the CLK90 signal is passed to master DLL 112. The signal at node 158 of master DLL 112 is referred to as CLKDLL signal.

Master DLL 112 includes a delay line 160 connected to node 158. Delay line 160 connects to a controller 162 via a plurality of control bits 164. Delay line 160 provides a delayed signal DLLout at node 166, which connects to a clock tree circuit 170. Clock tree circuit 170 generates capture clock signal CAPCLK at node 118. Clock tree circuit 170 also provides a feedback signal CLKFB to a model circuit 174 via line 172. Model circuit 174 receives the CLKFB signal and provides a master feedback signal CLKFBMS on line 178. A phase detector 180 connects to node 158 and 178 to receive the CLKDLL (CLKIN or CLK90) and the CLKFBMS signal. Phase detector 180 connects to controller 162 via a plurality of lines 182. From the arrangement of master DLL 122, clock receiver 103, MUX 116, delay line 160 and clock tree circuit 170 form a forward path 113; model circuit 174 is the feedback path 115, which is located between clock tree circuit 170 and phase detector 180.

Circuit elements of master DLL 112, such as delay line 160, clock tree circuit 170, phase detector 180, controller 162, and model circuit 174 are conventional circuit elements included in a delay locked loop. Slave DLL 114 can be any type of conventional delay locked loop, which can generate a clock signal with 90 degrees out of phase to the reference signal. Therefore, the constructions of these circuit elements of master DLL and slave DLL 112 and 114 will not be described in detailed in this disclosure.

In general, delay line 160 includes a plurality of delay cells connected in series, in which each of the delay cells can delay a signal for a predetermined amount of time. Depending on the number of delay cells selected, the amount of delay applied to the CLKDLL signal varies accordingly.

Phase detector 180 is used to detect a difference between the edges of two signals and provides shifting signals. The shifting signals include shift right and shift left signals. In this case, phase detector 180 compares the CLKDLL and CLKFBMS signals to provide shifting signals. When the CLKDLL and CLKFBMS signals are synchronized, phase detector 180 deactivates or disables the shifting signals.

Controller 162 includes a shift register, which performs shifting operations based on the shifting signals received from phase detector 180. The shifting operations can be a shift right or a shift left operation, which is performed to adjust the amount of delay applied to the CLKDLL signal at node 158. When shifting to the right, controller selects less delay cells in delay line 160 to decrease the amount of delay applied to the CLKDLL (CLKIN or CLK90) signal. In the opposite, when shifting to the left, controller selects more delay cells in delay line 160 to increase the amount of delay applied to the CLKDLL signal. By adjusting the delay amount applied to the CLKDLL signal, the CLKFBMS signal is adjusted accordingly. When the CLKDLL and CLKFBMS signals are synchronized, phase detector 180 disables the shifting signals. This causes controller 162 to stop performing the shifting and master DLL 112 is locked.

Model circuit 174 in the feedback path 115 includes a dummy MUX 175 and a clock receiver model 176, which is identical to the clock receiver 103. Dummy delay 175 is identical to MUX 116. Model circuit 174 is used to compensate the delay variations of the clock receiver 103 and MUX 116. Since clock receiver model 176 of model circuit 174 is identical to clock receiver 103, a delay of clock receiver model 176 is the same as a delay of clock receiver 103.

Clock tree circuit 170 can be a driver and receiver capable of receiving a signal and distributing or producing a plurality of output signals having the same signal characteristics. In FIG. 2, clock tree circuit 170 provides a plurality or multiple of capture clock signals such as the CAPCLK signal shown at node 118. For simplicity, only one CAPCLK signal is shown in FIG. 2. Since clock tree circuit 170 provides a multiple of capture clock signals, a multiple of data signals such as Din signal can be captured by other capture circuits such as capture circuit 130 using the multiple capture clock signals distributed by clock tree 170.

From the arrangement of capture clock generator 100 of FIG. 2, delay variations between clock receiver 103 and data receiver 122 are properly compensated because of the inclusion of model circuit 174 in feedback path 115 and data receiver model 105 in the forward path 113. In addition, since clock tree circuit 170 is included in the forward path of master DLL 112, delay variation of clock tree circuit 170 is also compensated. Thus, when both master DLL 112 and slave DLL 114 are locked, the CAPCLK signal is center aligned with the internal data signal Din.

Figure 3:
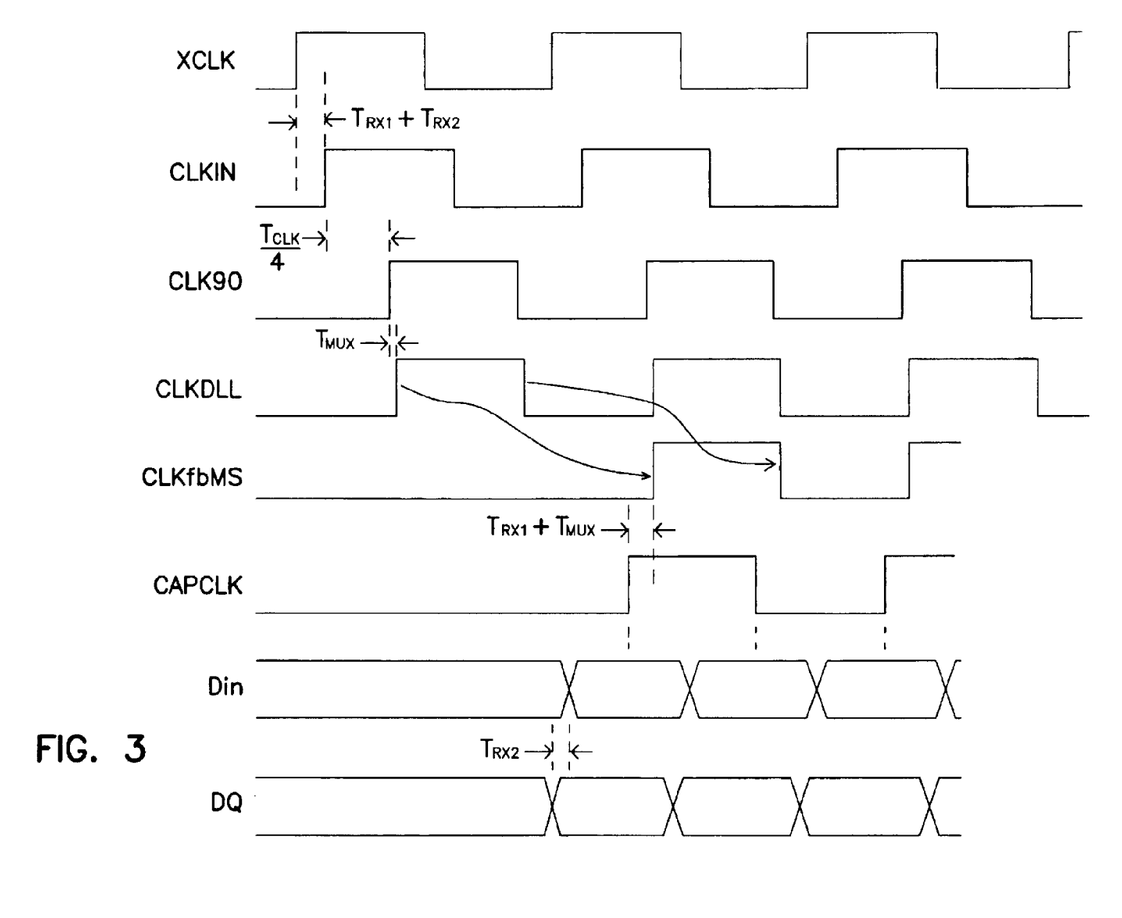
FIG. 3 is a timing diagram of the operation of the clock generator of FIG. 2.

The operation of clock generator 100 is described below with the timing diagram of FIG. 3. The signals shown in FIG. 3 represent the signals at their respective nodes or lines shown in FIG. 2. In operation, receiving circuit 102 receives XCLK signal at input 104 and output the CLKIN signal on node 106. Data receiver 122 receives the DQ signal at node 124 and provides the Din signal at node 126. Receiving circuit 102 has a propagation delay of $T_{RX1}+T_{RX2}$. $T_{RX1}$ is a delay of clock receiver 103; $T_{RX2}$ is a delay of data receiver model 105. Data receiver 122 has a delay of $T_{RX2}$ which is the same as data receiver model 105. In FIG. 3, the CLKIN signal follows the XCLK signal after a delay indicated by $T_{RX1}+T_{RX2}$. The Din signal follows the DQ signal after a delay indicated by $T_{RX2}$. For illustrating the invention, it is assumed that the XCLK and DQ signals are edge aligned.

Slave DLL 114 receives the CLKIN signal and produces the CLK90 signal. In FIG. 3, the CLK90 signal is 90 degrees (or ¼ clock cycle $T_{CLK}$ delay) out of phase with the CLKIN signal. Since the XCLK and DQ signals are assumed to be edge aligned, the SEL signal enables MUX to pass the CLK90 to master DLL 112.

At DLL 112, the CLKDLL signal is a delayed version of the CLK90 signal. The delay is caused by MUX 116. FIG. 3 shows that the CLKDLL signal follows the CLK90 signal after a $T_{MUX}$ delay; $T_{MUX}$ is a delay of MUX 116. After receiving the CLKDLL signal, delay line 160 applies an amount of delay to the CLKDLL signal and generates the DLLout signal on node 166. Thus, the DLLout signal is a delayed version of the CLKDLL signal. Clock tree circuit 170 receives the DLLout signal and generates the CAPCLK signal on node 118. The same version of the CAPCLK signal is also provided as the CLKFB signal, which is passed to the model circuit 174 of feedback path 115.

The output of the model circuit 174, the CLKFBMS signal, is fed back into the phase detector 180. Phase detector 180 compares the relative timing between the edges of the CLKDLL and CLKFBMS signals to provide shifting signals to controller 162 via lines 182. Controller 62, based on the shifting signals, adjusts the amount of delay applied to the CLKDLL signal until the CLKDLL and CLKFBMS signals are synchronized. When the CLKDLL and CLKFBMS signals are synchronized, phase detector 162 disables the shifting signals. This causes controller 162 to stop performing the shifting operations and master DLL 112 is locked.

In FIG. 3, when master DLL 112 is locked, the CLKDLL and CLKFBMS signals are synchronized. The CLKFBMS signal follows the CLKFB signal (or CAPCLK) after a delay $T_{RX1}+T_{MUX}$ caused by model circuit 174. $T_{MUX}$ is the delay of dummy MUX 175 which is the same as the delay of MUX 116. Since data receiver 122 has a delay of $T_{RX2}$, the Din signal is shown following the DQ signal after a delay indicated by $T_{RX2}$.

When both master DLL 112 and slave DLL 114 are locked, the CAPCLK signal provided by master DLL 112 is used to capture the Din signal at capture circuit 130. Since the timing relationship between the XCLK and DQ signals are properly adjusted by clock generator 100, the CAPCLK is center aligned with the Din signal.

Figure 4:
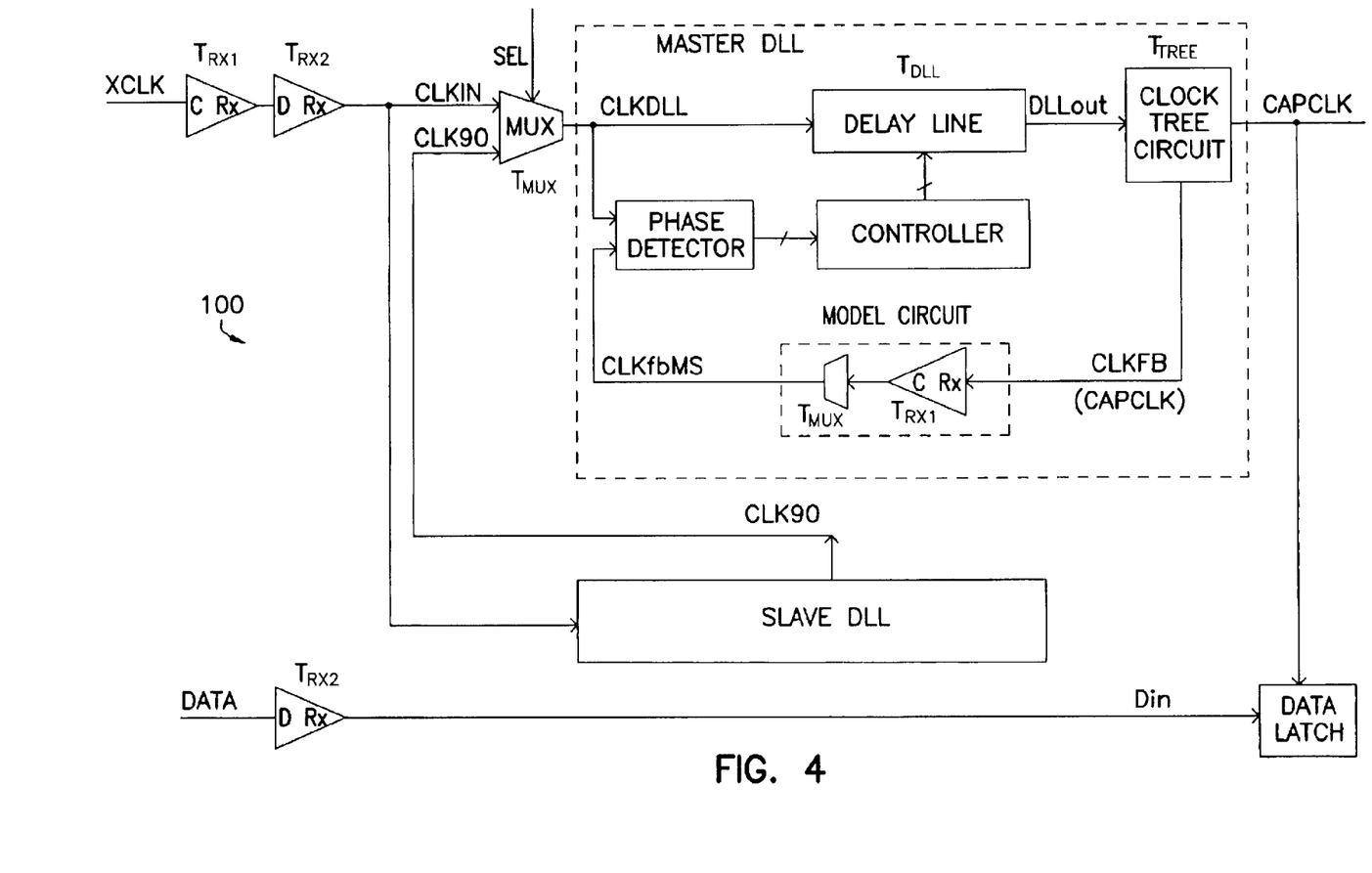
FIG. 4 is a diagram showing details of timing delays of the clock generator of FIG. 2.

FIG. 4 is a diagram showing details of timing delays of the clock generator 100 of FIG. 2. For clarity and simplicity, reference numbers of the elements of clock generator 100 are not included in FIG. 4. A time label in FIG. 4 indicates the delay time of the circuit element located next to the label. For example, $T_{RX1}$ indicates a delay time of the clock receiver C Rx, and $T_{RX2}$ indicates a delay time of the data receiver D Rx.

The following equations show timing relationships of the signals of clock generator 100 shown in FIG. 2.

$CLK90=CLKIN+(¼)T_{CLK}$ (when slave DLL is locked) a)

$XCLK=DQ$ (edge aligned) b)

$CLKIN=XCLK+T_{RX1}+T_{RX2}$ c)

$Din=DQ+T_{RX2}$ d)

$CAPCLK=CLKIN+T_{MUX}+T_{DLL}+T_{TREE}$ e)

$CLKFBMS=CAPCLK+T_{RX1}+T_{MUX}$ (passing the model circuit) f)

$CLKDLL=CLKIN+(¼)T_{CLK}+T_{MUX}$ g)

$CLKFBMS=CLKDLL+nT_{CLK}$ (when master DLL is locked) h)

$CAPCLK+T_{RX1}+T_{MUX}=CLKIN+(¼)T_{CLK}+T_{MUX}+nT_{CLK}=XCLK+T_{RX1}+T_{RX2}+(¼)T_{CLK}+T_{MUX}+nT_{CLK}$ $CAPCLK=XCLK+T_{RX2}+(¼)T_{CLK}+nT_{CLK}$ $CAPCLK=DQ+T_{RX2}+(¼)T_{CLK}+nT_{CLK}$ $CAPCLK=Din+(¼)T_{CLK}+nT_{CLK}$ g)

From equation g), the CAPCLK signal is equal to the internal data signal Din plus a quarter of a clock cycle; $T_{CLK}$ is the cycle time (period) of the XCLK signal. The $nT_{CLK}$ in equations h) and g)—where n is an integer—indicates that when the master DLL is locked, the CLKFBMS signal is at least one clock cycle behind the CLKDLL signal. If the delay time of the master DLL 112 is smaller than the clock period of the XCLK, then n is 1. If the delay time of the master DLL 112 is greater than one $T_{CLK}$, then n is two or more. In any case, any integer value of n will not affect the timing relationship between the CAPCLK and Din signals. In other words, the timing relationship between the CAPCLK and Din signals is independent of the frequency of the XCLK signal. In summary, equation g) demonstrates that the CAPCLK signal of clock generator 100 is always a quarter of clock cycle delayed from the Din signal. In other terms the CAPCLK signal is always center aligned with the Din signal.

Figure 5:
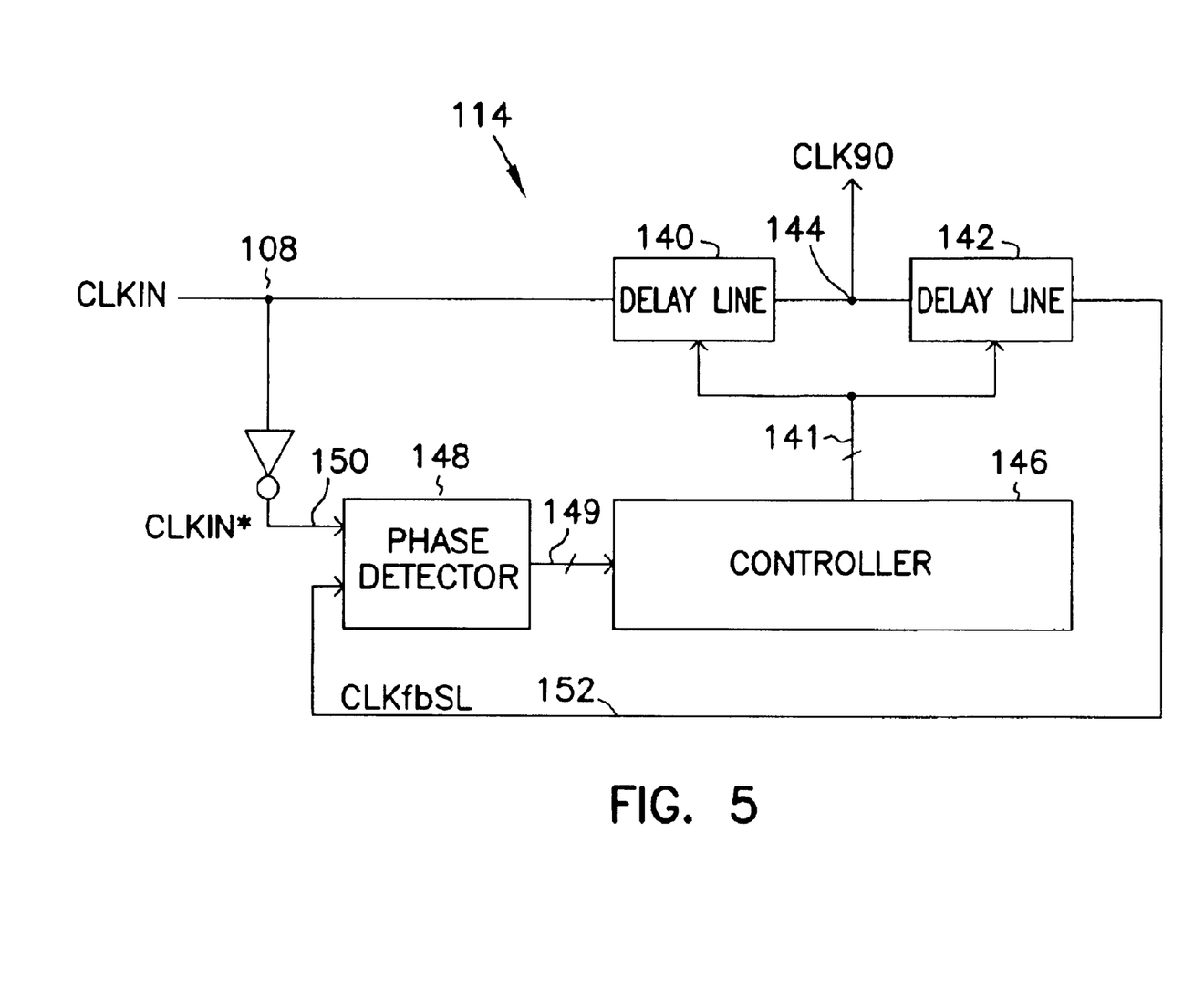
FIG. 5 is a block diagram of a slave DLL of the clock generator of FIG. 2.

FIG. 5 is a block diagram of slave DLL 114 according to one embodiment of the invention. Slave DLL 114 includes a first delay line 140 connected to a second delay line 142 via line or node 144. Delay line 140 receives the CLKIN signal and generates the slave output clock signal CLK90 at node 144. Delay line 142 receives the CLK90 signal at node 144 and generates the CLKFBSL signal at node 152. Delay lines 140 and 142 connect to controller 146 via a plurality of control bits 141. Controller 146 connects to a phase detector 148 via a plurality of lines 149. Phase detector 148 receives the CLKIN* and CLKFBSL signals at nodes 150 and 152. The CLKIN* signal is an inverse of the CLKIN signal.

In operation, delay line 140 applies an amount of delay to the CLKIN signal to produce the CLK90 signal at node 144. Delay line 142 applies the same amount of delay to the CLK90 signal to generate the CLKFBSL signal. Phase detector 148 compares the CLKIN* and CLKFBSL signals to produce shifting signals via lines 149 to controller 146. Controller 146 adjusts the amount of delay applied to the CLKIN and CLK90, based on the shifting signals, until the CLKIN* and CLKFBSL signals are synchronized. When the CLKIN* and CLKFBSL signals are synchronized, phase detector 148 disables the shifting signals on lines 149. This causes controller 146 to stop adjusting the amount of delay and slave DLL 114 is locked. When slave DLL 114 is locked, the CLK90 signal is one-fourth cycle delayed from the CLKIN signal, the CLKFBSL signal is one-half cycle delayed from the CLKIN signal. In other words, when slave DLL 114 is locked, the CLK90 signal is 90 degrees out of phase with the CLKIN signal, and the CLKFBSL signal is 180 degrees out of phase with the CLKIN signal.

Figure 6:
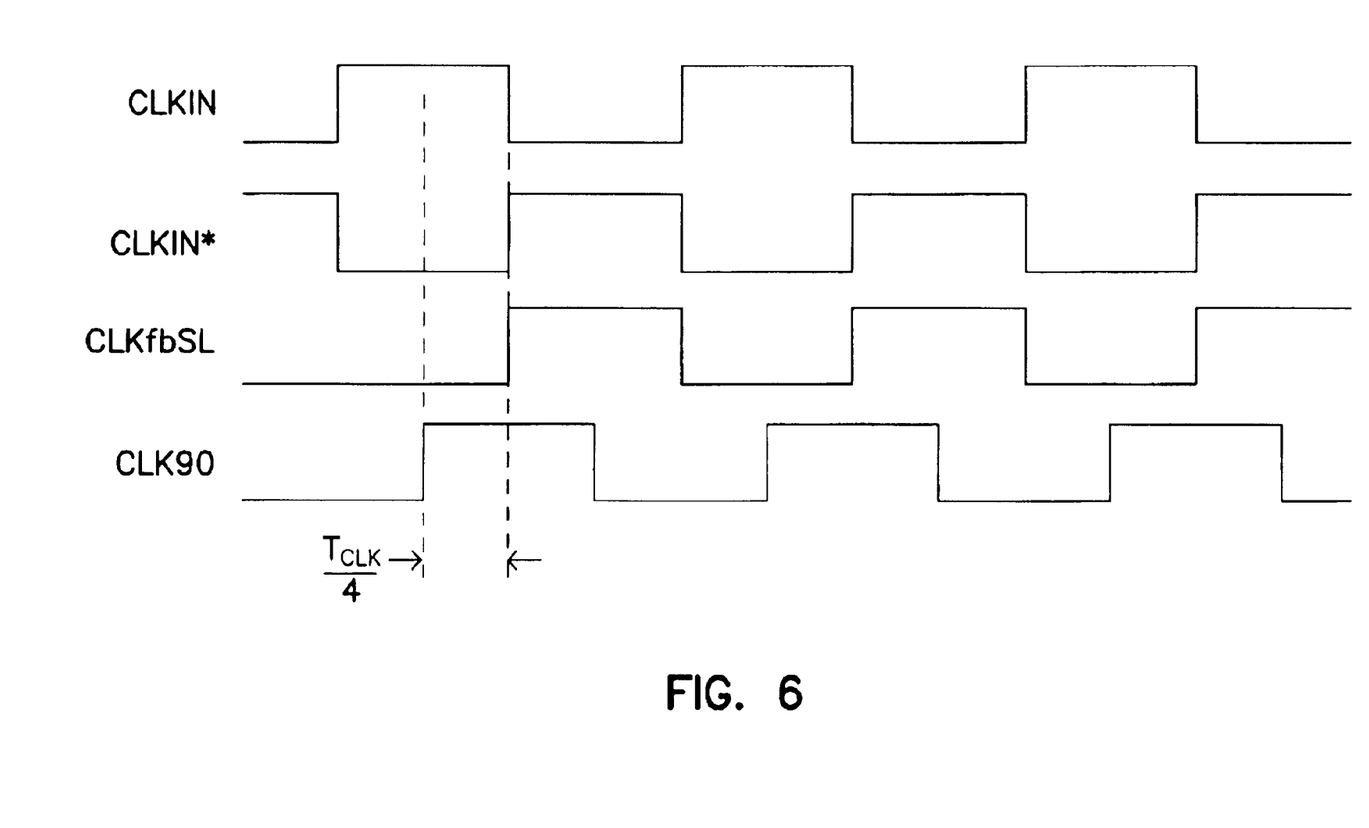
FIG. 6 is a timing diagram of the slave DLL of FIG. 5.

FIG. 6 is a timing diagram of the slave DLL 144 when it is locked. In the Figure, the CLKIN* signal is an inverse of the CLKIN signal. The CLKIN* and CLKFBSL signals are synchronized. The CLK90 is one-fourth clock cycle delayed from the CLKIN signal as indicated by (¼) $T_{CLK}$.

The purpose of slave DLL 114 of FIG. 5 is to receive an input clock signal, such as the CLKIN signal, and to produce an output clock signal, which is 90 degrees out of phase with the input signal. Thus, any type of DLL, either analog or digital, can be used to achieve the same purpose as slave DLL 114. Therefore, slave DLL 114 can be substituted by a DLL having a different construction from slave DLL 114 shown in FIG. 5.

Figure 7:
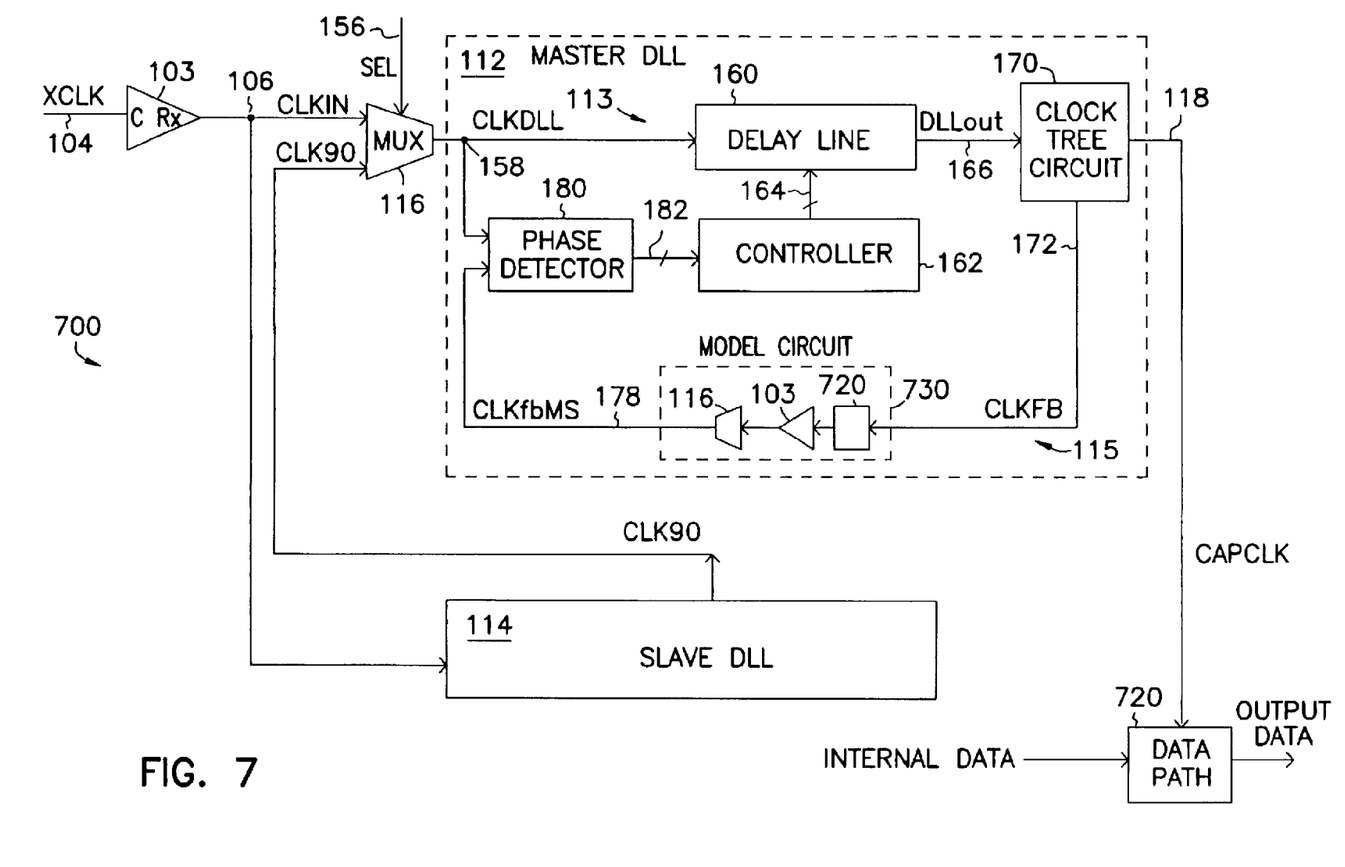
FIG. 7 is a block diagram of a clock generator according to another embodiment of the invention.

FIG. 7 is a block diagram of a clock generator 700 according to another embodiment of the invention. Clock generator 700 is similar to clock generator 100 of FIG. 2. However, clock generator 700 is used for another application according to the embodiment of the invention. In embodiment of FIG. 2, clock generator 100 generates a capture clock signal (CAPCLK) to capture an internal data signal (Din); the CAPCLK signal is center aligned with the Din signal. In the embodiment of FIG. 7, Clock generator 700 generates an output data signal OUTPUT DATA; the OUTPUT DATA signal is center aligned with the external clock signal XCLK.

In clock generator 700, the forward path 113 does not include a data receiver model. However, additional data path circuit 720 is included. Data path circuit 720 receives an internal data signal, indicated as INTERNAL DATA, and provides the OUTPUT DATA signal. In the embodiment of clock generator 700, the delay variations of the XCLK and OUTPUT DATA signals are compensated by a model circuit 730. Model circuit 730 includes models of MUX 116, clock receiver 103, and data path circuit 720.

Clock generator 700 operates in a similar fashion as clock generator 100 of FIG. 2. Slave DLL 114 receives the CLKIN signal and generates the CLK90 signal, which is 90 degrees out of phase with the CLKIN signal. MUX 116 passes the CLK90 signal to master DLL 112. Master DLL 112 receives the CLK90 signal and produces the CAPCLK signal. Data path circuit 720 receives the INTERNAL DATA and CAPCLK signals to generate the OUTPUT DATA signal. Because data path circuit 720 and clock receiver 103 are modeled in model circuit 730, when master DLL 112 is locked, the OUTPUT DATA signal is 90 degrees out of phase with the external clock signal XCLK. In summary, clock generator 700 uses slave DLL 114 and master DLL 112 to generate the output data signal OUTPUT DATA, which is center aligned with the XCLK signal.

Figure 8:
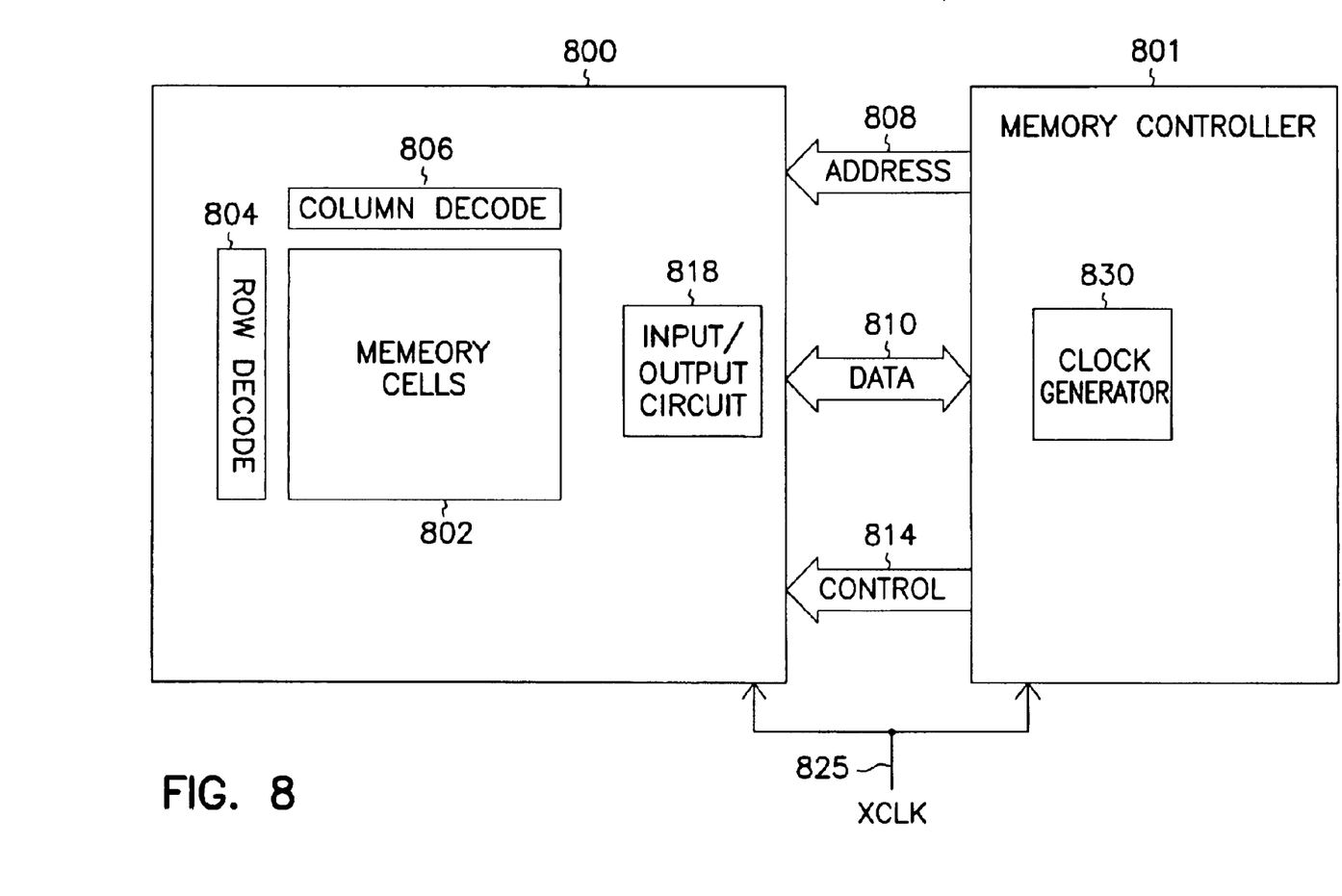
FIG. 8 is a block diagram of a memory device having the clock generator according to one embodiment the invention.

FIG. 8 is a block diagram of a memory system 800 according to one embodiment the invention. Memory system includes a memory device 800 and a memory controller 801. Memory device 800 includes a plurality of memory cells 802 generally arranged in rows and columns. Row decode circuit 804 and column decode circuit 806 access the rows and columns in response to an address, provided on a plurality of address lines 808. Data communication to and from memory device 800 are transmitted via input/output circuit 818 in response to command signals on control lines 814. Both memory device 800 and memory controller 801 receive an external clock signal XCLK on line 825. Memory controller 801 includes a clock generator 830. Clock generator 830 represents clock generator 100 or 700 according to the invention. Data is transferred between memory controller 801 and memory device 800 through data lines 810.

In a memory operation such as read operation, an external data signal read from memory cells 802 is sent to memory controller through lines 810. Clock generator 830 produces a capture clock signal, based on the XCLK signal, to capture an internal data signal, which is a delayed version of the data signal sent from memory cells 802. The capture clock signal is center aligned with the internal data signal. The external data signal, the internal data signal, and the capture clock signal described in this Figure are represented by the DQ, Din and CAPCLK signals in FIG. 2. In summary, clock generator 830 of memory controller 801 generates a capture clock signal to capture an internal data signal Din provided by memory device 800. The capture clock signal CAPCLK is center aligned with the internal data signal Din.

In another memory operation such as a write operation, data from memory controller 801 is written into memory cells 802 via lines 810 in response to address and control signals on lines 808 and 814. The signals provided on control, address and data lines 814, 808 and 810 are provided by clock generator 830. In this case, clock generator 830 represents clock generator 700 of FIG. 7. The signals provided on control, address and data lines 814, 808 and 810 are the signal represented by the OUTPUT DATA signal of data path circuit 720 of FIG. 7. In summary, clock generator 830 of memory controller 801 generates the data signal DATA as a control, address or data signal provided to memory device 800. The data signal DATA is center aligned with the external clock signal XCLK.

Memory device 800 of FIG. 8 can be a dynamic random access memory (DRAM) or other types of memory circuits such as SRAM (Static Random Access Memory) or Flash memories. Furthermore, the DRAM could be a synchronous DRAM commonly referred to as SGRAM (Synchronous Graphics Random Access Memory), SDRAM (Synchronous Dynamic Random Access Memory), SDRAM II, or DDR SDRAM (Double Data Rate SDRAM), as well as Synchlink or Rambus DRAMs. Those of ordinary skill in the art will readily recognize that memory device 800 of FIG. 8 is simplified to illustrate one embodiment of a memory device of the present invention and is not intended to be a detailed description of all of the features of a memory device.

Figure 9:
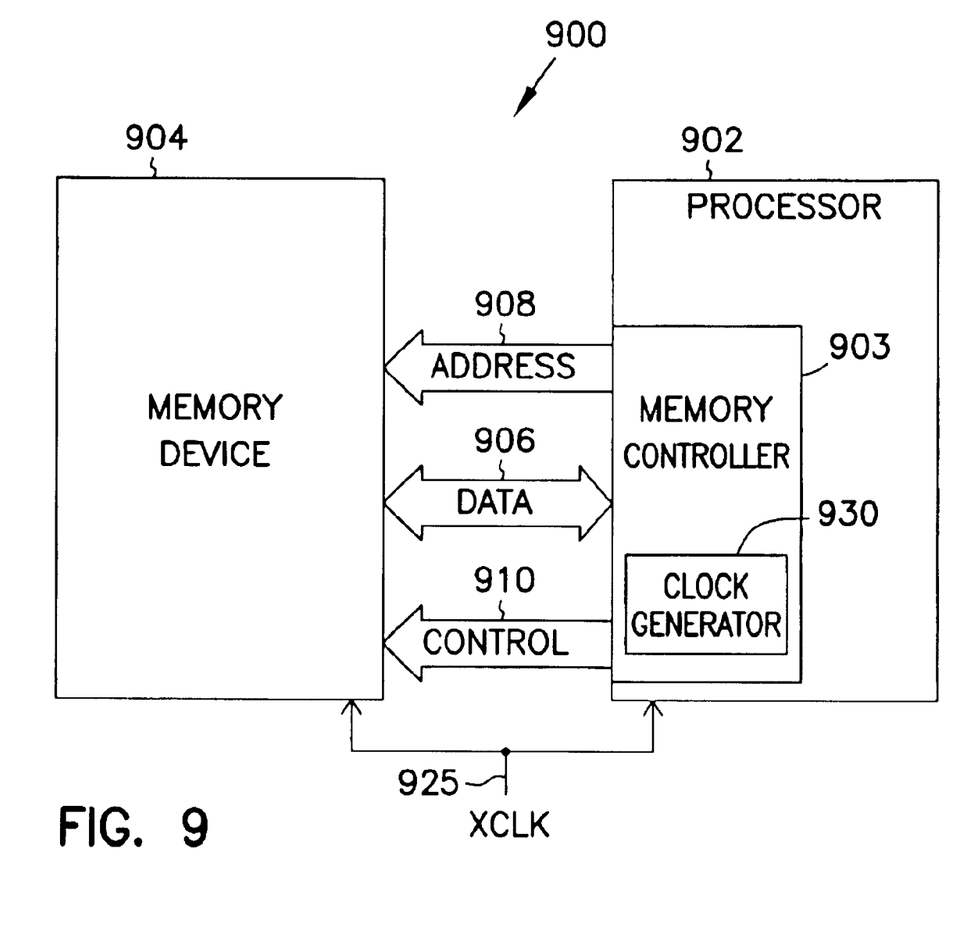
FIG. 9 is a block diagram of a system according to one embodiment of the invention.

FIG. 9 shows a processing system 900 according to the invention. System 900 includes processor 902 connected to a memory device 904. System 900 can also include many other devices such as, input/output devices, and others. These other devices are omitted from FIG. 9 for ease of illustration. Processor 902 can be a microprocessor, digital signal processor, embedded processor, microcontroller, or the like. In the embodiment of FIG. 9, processor 902 includes a memory controller 901 However, in other embodiments such as in the embodiment of FIG. 8, memory controller 930 is an independent device separated from processor 902. Processor 902 and memory device 904 communicate using address signals on lines 908, control signals on lines 910, and data signals on lines 906. Both processor 902 and memory device 904 receive an external clock signal XCLK on line 925.

Memory controller 901 includes clock generator 930. Clock generator 930 represents clock generator 100, 700 or 830 according to the invention as described and shown in FIG. 2, 7 or 8. According to the invention, clock generator 930 of memory controller 901 generates a capture clock signal to capture a data signal from memory device 904. The capture clock signal is center aligned with the data signal. According to the invention, clock generator 930 of memory controller 901 also generates a data signal as a control, address, or data signal provided to memory device 904. The data signal is center aligned with the external clock signal.

CONCLUSION

Although specific embodiments have been illustrated and described herein, it will be appreciated by those of ordinary skill in the art that any arrangement which is calculated to achieve the same purpose may be substituted For the specific embodiment shown. This application is intended to cover any adaptations or variations of the present invention. Therefore, it is intended that this invention be limited only by the claims and the equivalents thereof.

What is claimed is:

1. A clock generator comprising:
   a receiving circuit to receive an external clock signal to produce an internal clock signal, the receiving circuit including a first delay and a second delay;
   a data receiver to receive an external data signal to produce an internal data signal, wherein the data receiver includes a delay equal to the second delay of the receiving circuit;
   a first delay locked loop (DLL) to receive the internal clock signal to produce an output clock signal, wherein the output clock signal is 90 degrees out of phase with the internal clock signal; and a second DLL selectively connected to the first DLL to receive the output clock signal to generate a capture clock signal, wherein the capture clock signal is 90 degrees out of phase with the internal data signal.

2. The clock generator of claim 1, wherein the external clock signal is edge aligned with the external data signal.

3. A clock generator comprising:

a receiving circuit to receive an external clock signal to produce an internal clock signal;

a data receiver to receive an external data signal to produce an internal data signal;

a first delay locked loop (DLL) to receive the internal clock signal to produce an output clock signal, wherein the output clock signal is 90 degrees out of phase with the internal clock signal; and a second DLL selectively connected to the first DLL to receive the output clock signal to generate a capture clock signal, wherein the capture clock signal is 90 degrees out of phase with the internal data signal, wherein the receiving circuit includes a clock receiver and a data receiver model, wherein a delay of the data receiver model is the same as a delay of the data receiver.

4. A clock generator comprising:

a receiving circuit to receive an external clock signal to produce an internal clock signal:

a data receiver to receive an external data signal to produce an internal data signal:

a first delay locked loop (DLL) to receive the internal clock signal to produce an output clock signal, wherein the output clock signal is 90 degrees out of phase with the internal clock signal; and a second DLL selectively connected to the first DLL to receive the output clock signal to generate a capture clock signal, wherein the capture clock signal is 90 degrees out of phase with the internal data signal, wherein the first DLL includes:

a first delay line to provide a quarter of clock cycle delay to the internal clock signal to generate the output clock signal;

a second delay line to provide a quarter of clock cycle delay to the output clock signal to generate a feedback signal;

a phase detector to compare an inverse of the internal clock signal and the feedback signal; and a controller to provide control to the first and second delay lines.

5. A clock generator comprising:

a receiving circuit to receive an external clock signal to produce an internal clock signal:

a data receiver to receive an external data signal to produce an internal data signal:

a first delay locked loop (DLL) to receive the internal clock signal to produce an output clock signal, wherein the output clock signal is 90 degrees out of phase with the internal clock signal; and a second DLL selectively connected to the first DLL to receive the output clock signal to generate a capture clock signal, wherein the capture clock signal is 90 degrees out of phase with the internal data signal, wherein the second DLL includes:

a forward path comprising:
a clock receiver;
a delay line to apply an amount of delay to the output clock signal to generate a delayed signal; and
a clock tree to receive the delayed signal to generate the capture signal; and a feedback path to provide a feedback signal, the feedback path including a model circuit, wherein a delay of the model circuit includes a delay of the clock receiver.

6. The clock generator of claim 5, wherein the feedback signal of the second DLL and the output clock signal of the first DLL are synchronized.

7. A clock circuit comprising:

a receiving circuit to receive an external clock signal to produce an internal clock signal, the receiving circuit including a first delay and a second delay;

a data receiver to receive an external data signal to produce an internal data signal, wherein the data receiver includes a delay equal to the second delay of the receiving circuit;

a first delay locked loop (DLL) to receive the internal clock signal to produce a slave output clock signal, wherein the slave output clock signal is one-fourth clock cycle delayed from the internal clock signal; and a master DLL connected to the first DLL, the master DLL comprising:
a forward path to receive the slave output clock signal to produce a capture clock signal; and
a feedback path to receive the capture clock signal to produce a feedback signal, wherein the capture clock signal is center aligned with the internal data signal when the feedback and slave output signals are synchronized.

8. The clock circuit of claim 7, wherein the external clock signal is edge aligned with the external data signal.

9. A clock circuit comprising:

a receiving circuit to receive an external clock signal to produce an internal clock signal;

a data receiver to receive an external data signal to produce an internal data signal;

a first delay locked loop (DLL) to receive the internal clock signal to produce a slave output clock signal, wherein the slave output clock signal is one-fourth clock cycle delayed from the internal clock signal; and a master DLL connected to the first DLL, the master DLL comprising:
a forward path to receive the slave output clock signal to produce a capture clock signal; and
a feedback path to receive the capture clock signal to produce a feedback signal, wherein the capture clock signal is center aligned with the internal data signal when the feedback and slave output signals are synchronized, wherein the receiving circuit includes a clock receiver and a data receiver model, wherein a delay of the data receiver model is the same as a delay of the data receiver.

10. A clock circuit comprising:

a receiving circuit to receive an external clock signal to produce an internal clock signal;

a data receiver to receive an external data signal to produce an internal data signal;

a first delay locked loop (DLL) to receive the internal clock signal to produce a slave output clock signal, wherein the slave output clock signal is one-fourth clock cycle delayed from the internal clock signal; and a master DLL connected to the first DLL, the master DLL comprising:
  a forward path to receive the slave output clock signal to produce a capture clock signal; and
  a feedback path to receive the capture clock signal to produce a feedback signal, wherein the capture clock signal is center aligned with the internal data signal when the feedback and slave output signals are synchronized, wherein the first DLL includes:
a first delay line to apply a quarter of clock cycle delay to the internal clock signal produce the slave output clock signal;
a second delay line to apply a quarter of clock cycle delay to the slave output clock signal to produce a slave feedback signal;
a phase detector to compare an inverse of the internal clock and slave feedback signals to provide shifting signals; and
a controller to control the first and second delay lines based on the shifting signals to keep the inverse of the internal clock and slave feedback signals synchronized.

11. A clock circuit comprising:
a receiving circuit to receive an external clock signal to produce an internal clock signal;
a data receiver to receive an external data signal to produce an internal data signal;
a first delay locked loop (DLL) to receive the internal clock signal to produce a slave output clock signal, wherein the slave output clock signal is one-fourth clock cycle delayed from the internal clock signal; and
a master DLL connected to the first DLL, the master DLL comprising:
  a forward path to receive the slave output clock signal to produce a capture clock signal; and
  a feedback path to receive the capture clock signal to produce a feedback signal, wherein the capture clock signal is center aligned with the internal data signal when the feedback and slave output signals are synchronized, wherein the forward path includes:
a delay line to apply a delay to the output clock signal to generate a delayed signal; and
a clock tree to receive the delayed signal to generate a plurality of the capture clock signals.

12. A clock circuit comprising:
a receiving circuit to receive an external clock signal to produce an internal clock signal;
a data receiver to receive an external data signal to produce an internal data signal;
a first delay locked loop (DLL) to receive the internal clock signal to produce a slave output clock signal, wherein the slave output clock signal is one-fourth clock cycle delayed from the internal clock signal; and
a master DLL connected to the first DLL, the master DLL comprising:
  a forward path to receive the slave output clock signal to produce a capture clock signal; and
  a feedback path to receive the capture clock signal to produce a feedback signal, wherein the capture clock signal is center aligned with the internal data signal when the feedback and slave output signals are synchronized, wherein the forward path includes a clock receiver, the feedback path includes a model circuit, wherein a delay of the model circuit includes a delay of the clock receiver.

13. A clock circuit comprising:
a receiving circuit to receive an external clock signal to produce an internal clock signal, the receiving circuit including a first delay and a second delay;
a data receiver to receive an external data signal to produce an internal data signal, wherein the data receiver includes a delay equal to the second delay of the receiving circuit;
a first delay locked loop (DLL) comprising:
  a forward path to provide a slave output clock signal; and
  a feedback path to provide a feedback signal, wherein the slave output clock signal is 90 degrees out of phase with the internal clock signal when the feedback signal and an inverse of the internal clock signal are synchronized; and
a master DLL connected to the first DLL, the master DLL comprising:
  a forward path to receive the slave output clock signal to produce a capture clock signal; and
  a feedback path to receive the capture clock signal to produce a feedback signal, wherein the capture clock signal is center aligned with the internal data signal when the feedback and slave output signals are synchronized.

14. A clock generator comprising:
a receiving circuit to receive an external clock signal to produce an internal clock signal;
a data receiver to receive an external data signal to produce an internal data signal;
a slave delay locked loop (DLL) to receive the internal clock signal to produce a slave output clock signal, wherein the slave output clock signal is 90 degrees out of phase with the internal clock signal; and
a master DLL connected to the slave DLL, the master DLL comprising:
  a delay line to apply an amount of delay to the slave output clock signal to generate a delayed signal;
  a clock tree circuit to receive the delayed signal to generate a plurality of capture clock signals;
  a model circuit to receive one of the capture clock signals to generate a master feedback signal;
  a phase detector to provide shifting signals based on a phase difference between the slave output clock and the master feedback signals; and
  a control circuit to control the delay line to adjust the amount of delay applied to the slave output clock signal such that when the slave output clock and master feedback signals are synchronized the capture clock signal is center aligned with the internal data signal.

15. The clock generator of claim 14, wherein the external clock signal is edge aligned with the external data signal.

16. The clock generator of claim 14, wherein the receiving circuit includes a clock receiver, the model circuit includes a model delay, wherein the model delay includes a delay of the clock receiver.

17. The clock generator of claim 14, wherein the receiving circuit includes a clock receiver and a model of the data receiver.

18. The clock generator of claim 17, wherein the model circuit includes a model of the clock receiver.

19. A clock generator comprising:
a receiving circuit to receive an external clock signal to produce an internal clock signal, the receiving circuit including a clock receiver and a model of a data receiver;

a data receiver to receive an external data signal to produce an internal data signal;
a slave delay locked loop (DLL) comprising:
 a forward path to provide a slave output clock signal; and
 a feedback path to provide a feedback signal, wherein the slave output clock signal is 90 degrees out of phase with the internal clock signal when the feedback signal and an inverse of the internal clock signal are synchronized;
a master DLL connected to the slave DLL, the master DLL comprising:
 a delay line to apply an amount of delay to the slave output clock signal to generate a delayed signal;
 a clock tree circuit to receive the delayed signal to generate a plurality of capture clock signals;
 a model circuit to receive one of the capture clock signals to generate a master feedback signal, wherein a delay of the model circuit includes a delay of the clock receiver;
 a phase detector to provide shifting signals based on a phase difference between the slave output clock and the master feedback signals; and
 a control circuit to control the delay line to adjust the amount of delay applied to the slave output clock signal such that when the slave output clock and master feedback signals are synchronized the capture clock signal is center aligned with the internal data signal.

20. A clock generator comprising:
a clock receiver to receive an external clock signal to produce an internal clock signal, the clock receiver including a clock receiver delay;
a first delay locked loop (DLL) to receive the internal clock signal to produce an output clock signal, wherein the output clock signal is 90 degrees out of phase with the internal clock signal;
a second DLL selectively connected to the first DLL to receive the output clock signal to generate a capture clock signal, the second DLL including a first delay, and a second delay equal to the clock receiver delay; and
a data path circuit to receive an internal data signal and the capture clock signal to generated an output data signal, the data path including a delay equal to the first delay of the second DLL, wherein the output data signal is center aligned with the external clock signal.

21. A clock generator comprising:
a clock receiver to receive an external clock signal to produce an internal clock signal;
a first delay locked loop (DLL) to receive the internal clock signal to produce an output clock signal, wherein the output clock signal is 90 degrees out of phase with the internal clock signal;
a second DLL selectively connected to the first DLL to receive the output clock signal to generate a capture clock signal; and
a data path circuit to receive an internal data signal and the capture clock signal to generated an output data signal, wherein the output data signal is center aligned with the external clock signal, wherein the second DLL includes:
a delay line to apply a delay to the output clock signal to generate a delayed signal; and
a clock tree to receive the delayed signal to generate a plurality of the capture clock signals.

22. A clock generator comprising:
a clock receiver to receive an external clock signal to produce an internal clock signal;
a first delay locked loop (DLL) to receive the internal clock signal to produce an output clock signal, wherein the output clock signal is 90 degrees out of phase with the internal clock signal;
a second DLL selectively connected to the first DLL to receive the output clock signal to generate a capture clock signal; and
a data path circuit to receive an internal data signal and the capture clock signal to generated an output data signal, wherein the output data signal is center aligned with the external clock signal, wherein the second DLL includes a model circuit, wherein a delay of the model circuit includes a delay of the clock receiver and a delay of the data path circuit.

23. A clock generator comprising:
a clock receiver to receive an external clock signal to produce an internal clock signal;
a first delay locked loop (DLL) to receive the internal clock signal to produce an output clock signal, wherein the output clock signal is 90 degrees out of phase with the internal clock signal;
a second DLL selectively connected to the first DLL to receive the output clock signal to generate a capture clock signal; and
a data path circuit to receive an internal data signal and the capture clock signal to generated an output data signal, wherein the output data signal is center aligned with the external clock signal, wherein the second DLL includes a model circuit, and, wherein the model circuit includes a model of the clock receiver and a model of the data path circuit.

24. A clock generator comprising:
a clock receiver to receive an external clock signal to produce an internal clock signal;
a delay line to apply an amount of delay to the internal clock signal to generate a delayed signal;
a clock tree circuit to receive the delayed signal to generate a plurality of capture clock signals;
a model circuit to receive one of the capture clock signals to generate a feedback signal, wherein a delay of the model circuit is equal to a delay of the clock receiver and a delay of the data path circuit;
a phase detector to provide shifting signals based on a phase difference between the internal clock and the feedback signal;
a control circuit to control the delay line to adjust the amount of delay applied to the internal clock signal; and
a data path circuit to receive an internal data signal and one of the capture clock signals to generated an output data signal, wherein the output data signal is center aligned with the external clock signal.

25. A memory system comprising:
a memory device including a plurality of memory cells; and
a memory controller connected to the memory device, the memory controller comprising:
 a receiving circuit to receive an external clock signal to produce an internal clock signal, the receiving circuit including a first delay and a second delay;
 a data receiver to receive an external data signal from the memory device to produce an internal data signal, wherein the data receiver includes a delay equal to the second delay of the receiving circuit;

a first delay locked loop (DLL) to receive the internal clock signal to produce an output clock signal, wherein the output clock signal is 90 degrees out of phase with the internal clock signal; and a second DLL selectively connected to the first DLL to receive the output clock signal to generate a capture clock signal, wherein the capture clock signal is 90 degrees out of phase with the internal data signal.

26. The memory system of claim 25, wherein the external data signal includes a data signal stored in one of the memory cells.

27. The memory system of claim 25, wherein the external data signal includes a data signal read from one of the memory cells during a read operation.

28. A memory system comprising:

a memory device including a plurality of memory cells; and a memory controller connected to the memory device, the memory controller comprising:

a clock receiver to receive an external clock signal to produce an internal clock signal, the clock receiver including a clock receiver delay;

a first delay locked loop (DLL) to receive the internal clock signal to produce an output clock signal, wherein the output clock signal is 90 degrees out of phase with the internal clock signal;

a second DLL selectively connected to the first DLL to receive the output clock signal to generate a capture clock signal, the second DLL including a first delay equal to the clock receiver delay, and a second delay; and a data path circuit to receive an internal data signal and the capture clock signal to generate an output data signal, the data path including a delay equal to the second delay of the second DLL, wherein the output data signal is center aligned with the external clock signal.

29. The memory system of claim 28, wherein the output data signal includes an address signal provided to the memory device during a memory write operation.

30. The memory system of claim 28, wherein the output data signal includes a control signal provided to the memory device during a memory write operation.

31. A system comprising:

a processor;

a memory device connected to the processor, the memory device including a plurality of memory cells to store data; and a memory controller connected to the memory device, the memory controller comprising:

a receiving circuit to receive an external clock signal to produce an internal clock signal, the receiving circuit including a first delay and a second delay;

a data receiver to receive an external data signal from the memory device to produce an internal data signal, wherein the data receiver includes a delay equal to the second delay of the receiving circuit;

a slave delay locked loop (DLL) to receive the internal clock signal to produce a slave output clock signal, wherein the slave output clock signal is 90 degrees out of phase with the internal clock signal; and a master DLL selectively connected to the slave DLL to receive the slave output clock signal to generate a capture clock signal, wherein the capture clock signal is 90 degrees out of phase with the internal data signal.

32. A system comprising:

a processor;

a memory device connected to the processor, the memory device including a plurality of memory cells to store data; and a memory controller connected to the memory device, the memory controller comprising:

a clock receiver to receive an external clock signal to produce an internal clock signal, the clock receiver including a clock receiver delay;

a first delay locked loop (DLL) to receive the internal clock signal to produce an output clock signal, wherein the output clock signal is 90 degrees out of phase with the internal clock signal;

a second DLL selectively connected to the first DLL to receive the output clock signal to generate a capture clock signal, the second DLL including a first delay equal to the clock receiver delay, and a second delay; and a data path circuit to receive an internal data signal and the capture clock signal to generate an output data signal, the data path including a delay equal to the second delay of the second DLL, wherein the output data signal is center aligned with the external clock signal.

33. A method of generating a capture clock signal, the method comprising:

receiving an external clock signal, and delaying the external clock signal with a first delay and a second delay to generate an internal clock signal;

receiving an external data signal, and delaying the external data signal with a delay equal to the second delay of the external clock signal to generate an internal data signal;

generating a output clock signal based on the internal clock signal, wherein the output clock signal is 90 degrees out of phase with the internal clock signal;

generating a capture clock signal based on the output clock signal; and generating a feedback signal from the capture clock signal such that the capture clock signal is center aligned with the internal data signal when the feedback and output signals are synchronized.

34. The method of claim 33, wherein generating a capture clock signal include passing a delay signal generated from the internal clock signal to a clock tree circuit.

35. The method of claim 33, wherein receiving an external clock signal includes passing the external clock signal through a clock receiver.

36. The method of claim 35, wherein receiving an external data signal includes passing the external data signal through a data receiver.

37. A method of generating a capture clock signal, the method comprising:

receiving an external clock signal;

receiving an external data signal;

generating a output clock signal based on the internal clock signal, wherein the output clock signal is 90 degrees out of phase with the internal clock signal;

generating a capture clock signal based on the output clock signal; and generating a feedback signal from the capture clock signal such that the capture clock signal is center aligned with the internal data signal when the feedback and output signals are synchronized, wherein receiving an external clock signal includes passing the external clock signal through a clock receiver, wherein receiving an external data signal includes passing the external data signal through a data receiver, wherein generating a feedback signal include passing the capture clock signal through a model circuit, and wherein a delay of the model circuit includes a delay of the clock receiver.

38. A method of capturing a signal, the method comprising:

receiving an internal data signal;

generating an output clock signal from an internal clock signal, wherein the output clock signal is 90 degrees out of phase with the internal clock signal;

generating a capture clock signal from the output clock signal, wherein generating the capture clock signal includes passing a delayed version of the internal clock signal through a feedback path, wherein the feedback path includes a first delay, and a second delay equal to the clock receiver delay; and capturing the internal data signal such that the capture clock signal is center aligned with the internal data signal, wherein capturing the internal data signal includes delaying the internal data signal with a delay equal to the first delay of the feedback path.

39. A method of capturing a signal, the method comprising:

receiving an internal data signal;

generating an output clock signal from an internal clock signal, wherein the output clock signal is 90 degrees out of phase with the internal clock signal;

generating a capture clock signal from the output clock signal;

capturing the internal data signal such that the capture clock signal is center aligned with the internal data signal;

passing an external clock signal through a receiving circuit having a clock delay;

passing an external data signal through a data receiver having a data delay;

generating a feedback signal from the capture clock signal by passing the capture clock signal through a model circuit, wherein a delay of the model circuit includes the clock delay; and synchronizing the internal clock and the feedback signal.

40. A method of generating a signal, the method comprising:

receiving an external clock signal, and delaying the external clock signal with a clock receiver delay to generate an internal clock signal;

generating an output clock signal based on the internal clock signal, wherein the output clock signal is 90 degrees out of phase with the input clock signal;

generating a capture clock signal based on the output clock signal, wherein generating the capture clock signal includes passing a delayed version of the internal clock signal through a feedback path, wherein the feedback path includes a first delay, and a second delay equal to the clock receiver delay; and capturing an internal data signal with the capture clock signal to produce an output data signal, wherein capturing the internal data signal includes delaying the internal data signal with a delay equal to the first delay of the feedback path, wherein the output data signal is center aligned with the external clock signal.

41. The method of claim 40 further includes generating a feedback signal by delaying the capture clock signal.

42. The method of claim 41, wherein delaying the capture clock signal includes passing the capture clock signal through a modeled delay.

43. A method of generating a signal, the method comprising:

receiving an external clock signal to generate an internal clock signal;

generating an output clock signal based on the internal clock signal, wherein the output clock signal is 90 degrees out of phase with the input clock signal;

generating a capture clock signal based on the output clock signal;

capturing an internal data signal with the capture clock signal to produce an output data signal, wherein the output data signal is center aligned with the external clock signal;

generating a feedback signal by delaying the capture clock signal, wherein delaying the capture clock signal includes passing the capture clock signal through a model delay;

passing the external clock signal through a clock receiver; and passing the internal data through a data receiver, wherein a delay of the clock receiver and a delay of the data receiver are included in the model delay.

* * * * *

UNITED STATES PATENT AND TRADEMARK OFFICE
CERTIFICATE OF CORRECTION

PATENT NO. : 6,839,860 B2
DATED : January 4, 2005
INVENTOR(S) : Lin

It is certified that error appears in the above-identified patent and that said Letters Patent is hereby corrected as shown below:

<u>Title page,</u>
Item [73], Assignee, delete "Mircon" and insert -- Micron --, therefor.

Signed and Sealed this

Seventeenth Day of May, 2005

JON W. DUDAS
*Director of the United States Patent and Trademark Office*